United States Patent [19]

Crawford

[11] Patent Number: 4,939,476

[45] Date of Patent: Jul. 3, 1990

[54] LASER RANGEFINDER RECEIVER PREAMPLIFIER

[76] Inventor: Ian D. Crawford, 1805 Meadowbend Dr., Longwood, Fla. 32750

[21] Appl. No.: 290,567

[22] Filed: Dec. 27, 1988

[51] Int. Cl.⁵ .............................................. H03F 17/00
[52] U.S. Cl. .................................. 330/59; 250/214 A; 455/619
[58] Field of Search ............. 330/59, 308; 250/214 A; 455/619

[56] References Cited

FOREIGN PATENT DOCUMENTS 54744 3/1983 Japan .................................. 455/619

Primary Examiner—James B. Mullins
Attorney, Agent, or Firm—Julian C. Renfro

[57] ABSTRACT

A preamplifier for a laser rangefinder receiver having two signal level modes comprises, in accordance with this invention, a light detector having a first load resistor, and a buffer having an input connected across the load resistor and an output to the receiver. A first diode is placed in series with a second diode, with the second diode being connected in parallel with a second load resistor. A positive feedback path is provided from the output to the junction of the first and second diodes, wherein the first and second diodes are nonconductive during a low signal level mode, and conductive during a high signal level mode.

12 Claims, 1 Drawing Sheet

LASER RANGEFINDER RECEIVER PREAMPLIFIER

BACKGROUND OF THE INVENTION

1. Technical Field

The present invention relates to laser rangefinder receiver preamplifiers, and more particularly to an improved preamplifier having high gain, insensitivity to overload, and fast recovery time.

2. Background Art

Laser rangefinders are used to measure distance, and in the prior art, a suitable laser transmitter is used to beam a high intensity pulse of light onto a selected target. The light scattered from the target is detected by an optical receiver, normally co-located with the laser transmitter. By measuring the transit time between the transmitted laser pulse and the received echo, the range to the target can be determined using a time-interval counter.

Silicon avalanche photo-detectors have been commonly used to convert the echoed light pulse into an electrical current. These detectors provide amplification of the signal and therefore the noise contribution of the preamplifier is not critical in determining sensitivity.

Recently, laser rangefinders have been designed to function at wavelengths of 1.5 microns and longer in an effort to substantially reduce the hazard to human eyes caused by viewing of the laser beam. The popular and efficient silicon avalanche detectors do not function at these wavelengths, thus necessitating the use of other types of detectors, such as those made from germanium or indium gallium arsenide. The responsivity of these eyesafe wavelength detectors is much less than the silicon avalanche detectors, and the ability of the rangefinder to function effectively with the weak echoes associated with long range targets requires the use of a low-noise, high-gain preamplifier.

Avalanche detectors require precise control of bias voltage, necessitating complex circuits. The use of low gain detectors, for example silicon PIN type, avoids this complexity, but requires a low-noise, high gain preamplifier.

The laser pulse widths used for rangefinding are normally between 5ns and 30ns wide, requiring a typical receiver bandwidth of 5 MHz to 30 MHz for amplification. The noise of the preamplifier is dominated by the thermal noise of the detector load resistor or the preamplifier transimpedance resistor. It is well known that for a low current noise, this resistance must be high. Such receivers using high resistor values generating low noise are used in fiber optics communication.

In a laser rangefinder receiver, the magnitude of the echo pulse varies over many orders of magnitude due to target reflectivity, target size, weather, laser power, and target range. Especially at short ranges, the high-gain, high-impedance preamplifier that is typically utilized to achieve low noise may overload due to excessive detector current. This causes amplifier saturation and results in blocking of targets during the overload condition. The overload may be caused by backscatter from common transmit and receive optics, mist, retroreflecting targets, or as a result of objects close to, or partially intercepting, the beam. Such blocking results in an inability of the rangefinder to measure the distance to certain targets.

There is therefore an unfilled need for a laser rangefinder receiver that has high gain, insensitivity to overload and fast recovery time in cases where silicon avalanche detectors cannot be used due to wavelength incompatibility or a requirement for simplicity.

DISCLOSURE OF INVENTION

The present invention is related to a laser rangefinder receiver having a combination of high long-range sensitivity, resistance to overloads, and the ability to recover rapidly from strong overload signals.

My invention is a preamplifier for a laser rangefinder receiver having a light detector diode which may utilize germanium, indium gallium arsenide or silicon PIN types. The detector produces a current pulse output from a laser pulse incident on the diode. This current converts into a voltage pulse across a first load resistor and drives a buffer. The buffer output is available to the following receiver stages.

When a low power laser pulse strikes the detector, the preamplifier operates in a small signal mode and the voltage developed across the first load resistor will be directly proportional to the laser pulse amplitude. The buffer will deliver an output signal determined by the detector current and the load impedance.

The preamplifier includes a positive feedback loop from the output of the buffer adjusted to produce a pulse voltage equal to or slightly less than the voltage across the load resistor. The feedback voltage is applied via a capacitor and resistor network to a second load resistor in parallel with a second diode connected by a first diode to the first load resistor. Under small signal conditions, the first diode isolates the second load in the network from the first load resistor. The feedback voltage applied to the junction of the diode and the second load causes virtually equal signal voltages on both anode and cathode of the diode under small signal conditions, resulting in virtually no charging or discharging of the diode capacitance. The result is that the effective diode capacitance is nearly zero and it does not load the first load resistor. This is important, because for low-noise operation, the value of the first load resistor must be high. Any capacitance loading will result in a high-frequency-cut filter which will reduce the preamplifier gain at high frequencies.

Thus, the present invention advantageously results in a very low capacitance value across the first load resistor, enabling a high value, low current noise resistor to be used.

When a high amplitude signal is detected, the feedback voltage is sufficient to cause the clamp diode across the second load resistor to conduct an amount of current sufficient to bring the voltage across the paralleled load resistors down below the overload point, thereby operating in a large signal level mode. The impedance of the second load resistor/diode is much less than the first load resistor, allowing fast response with the normal diode capacitance.

This invention requires a minimum of parts, each of which is available at low cost.

Thus, a preamplifier for a laser rangefinder receiver is provided in which a wide range of input signals can be processed without overloading or saturating the buffer devices utilized. Such operation results in controlled rapid recovery and low noise, high sensitivity performance.

It is therefore a principal object of this invention to provide a laser rangefinder receiver preamplifier having low noise to produce long range measurement, resistance to overload, and fast recovery from overload level signals, thus enabling the accurate measurement of range to a wide variety of targets.

It is another object of my invention to provide a laser rangefinder preamplifier operating in several gain modes, enabling operation over a wide dynamic range of input signal levels.

It is still another object of my invention is to provide a laser rangefinder receiver preamplifier advantageously combining high long-range sensitivity with the ability to recover rapidly from strong overload level signals, accomplished in an effective, low cost device.

These and other objects, features and advantages of my invention will become apparent from the following detailed description when read in conjunction with the drawing.

and

Figure 2:
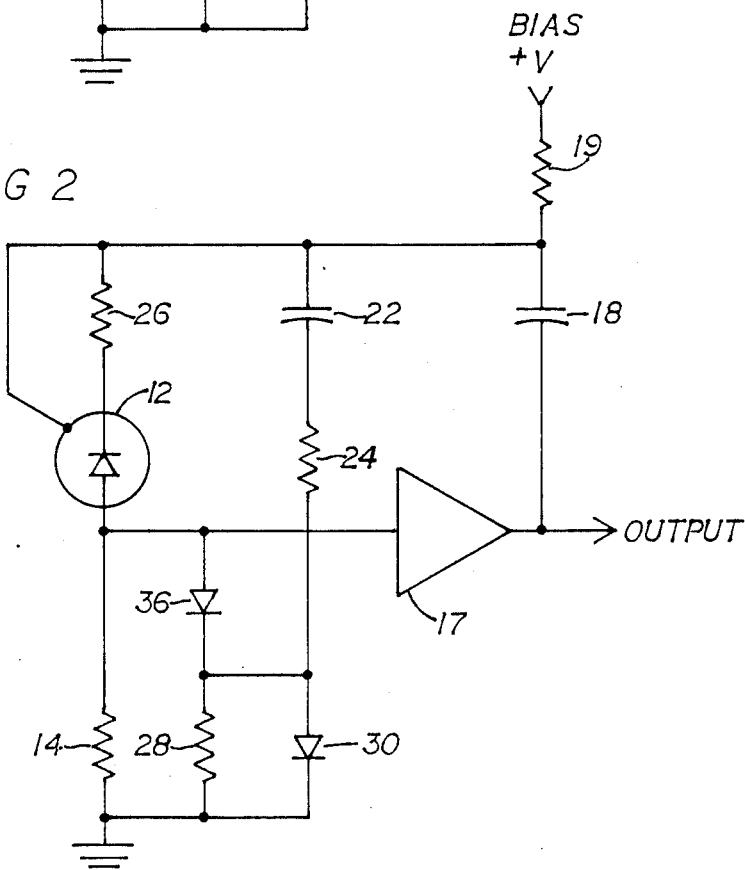
FIG. 2 is a schematic diagram of an alternative preamplifier of the invention.
Figure 4:
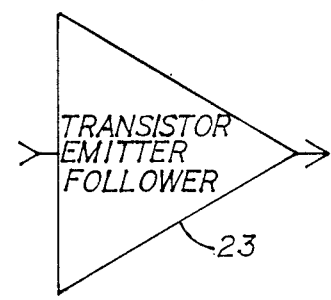

FIG. 4 is a block schematic diagram of a transistor emitter follower for use in the circuit of FIG. 2.

BEST MODE FOR CARRYING OUT THE INVENTION

The present invention is an improved preamplifier for a laser rangefinder receiver. A preferred embodiment of the invention is shown in simplified schematic form in FIG. 1. A light detector 12 receives reflected pulses of light from an illuminated target. A dc bias from supply voltage +V is applied to detector 12 via buffer 20 and resistor 26. Resistor 14 between detector 12 and ground provides a load for detector 12. Load resistor 14 has a high resistance and the detector circuit represents a high impedance signal current source.

When a light pulse impinges on detector 12, light induced current $I_s$ from the bias source flows through load resistor 14, producing a voltage pulse $V_s$ which is applied to the input of buffer 16. Buffer 16, which may hereinafter be referred to as the first buffer, has a high input impedance and a low output impedance. Typically, buffer 16 may be a field effect transistor (FET) source follower, using for example, a 2N4416. Alternatively, a transistor emitter follower may be used with a 2N2857 or similar transistor. Integrated circuits also available are suitable for this element. The output from buffer 16 is available for the following distance measuring circuitry of the rangefinder receiver.

Capacitor 18 provides a feedback path from the output of buffer 16. Capacitor 18 passes the signal from buffer 16 output to buffer 20, hereinafter referred to as the second buffer. The output from second buffer 20 produces a feedback current $I_{fb}$ via capacitor 22 and resistor 24 to diode 30 in parallel with resistor 28 to ground. Diode 36, hereinafter referred to as the first diode, is connected between the output of detector 12 and the upper end of resistor 28. Resistor 19 isolates the bias source from the signal feedback path.

The gains of buffers 16 and 20 may be low and adjusted such that the feedback voltage for a low level signal $V_s$ due to the flow of current $I_{fb}$ through resistor 28 is nearly equal to the voltage of pulse $V_s$. Therefore, there is negligible potential across diode 36 and this diode is nonconducting and produces no loading of detector load resistor 14. Preferably, diode 36 should have a low capacitance, on the order of 1 pf, and fast recovery characteristics. A fast recovery Schottky type such as an HP5082-2811 is eminently suitable. Two or more diodes in series may be used to reduce the total capacitance. Diode 30, hereinafter referred to as the second diode, may be a computer type switching diode such as a 1N4305, or a zener diode in which the breakdown voltage is selected in accordance with the desired pulse amplitude for limiting.

Having described the circuit of FIG. 1, the operation thereof will be explained. Assuming negligible detector leakage current, the voltage across resistors 14 and 28 will be zero when no light falls on detector 12. Assuming now that a low level light pulse is incident on detector 12, the resulting current $I_s$ produces a pulse $V_s$ across resistor 14 having a low peak value. The feedback current $I_{fb}$ produces an equal voltage $V_s$ across resistor 28 which is less than the voltage required to cause diode 30 to conduct. There is no potential across diode 36, which remains nonconducting. Thus, resistor 14 is the only load for detector 12. This operation is considered to be a low-signal mode.

When a larger light pulse occurs such that diode 30 begins to conduct, the peak values of $V_s$ remain below the saturation level of the distance measurement circuits and resistor 28 acts to discharge the capacitance of diodes 30 and 36. For stronger signals, which increase the peak value of $V_s$, a point will be reached at which diode 36 conducts. The load for detector 12 then becomes the series resistance of conducting diodes 36 and 30. The pulsed voltage from buffer 20 is, of course, limited and a constant bias voltage is maintained across the series combination of detector 12 and resistor 26. Buffer 20 is selected to be capable of supplying the light-induced pulse current for all expected peak light intensities.

Resistor 26 is used to limit the detector current in an overload condition, but is normally a low value to ensure fast detector recovery. Resistor 24 prevents a large pulse current from flowing through diode 30. The time constant of capacitor 22 and resistor 24 may be optimized for recovery performance, but is normally selected to be several times the signal pulse width. This permits a small charge to be collected by capacitor 22 when a signal pulse occurs. After the pulse, capacitor 22 will be driven in a negative direction by the low output impedance buffer 20. The collected charge serves to reverse bias diode 30, assisting in rapid recovery to the non-conducting mode.

Resistor 24 is normally small compared to resistor 28 to avoid a loss of signal due to resistive division. The buffered pulsed signal applied to the detector bias via resistor 26 is normally arranged to equal or just less than the voltage $V_s$ to avoid oscillation.

Figure 1:
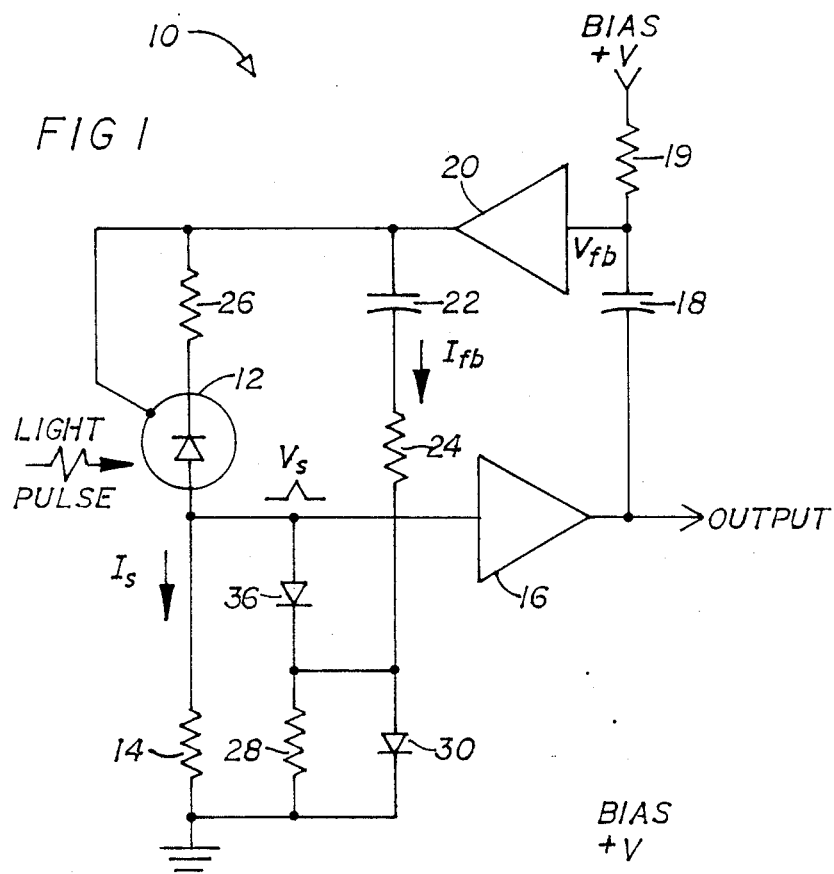
FIG. 1 is a simplified schematic diagram of the improved laser rangefinder preamplifier of the invention.
Figure 3:
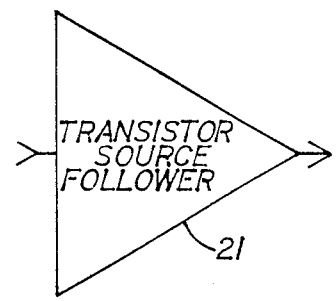
FIG. 3 is a block schematic diagram of a transistor source follower for use in the circuits of FIG. 1 and FIG. 2.

Buffers 16 and 20 of FIG. 1 are shown in generalized schematic form. It will be understood by those of skill in the art that various types of buffer circuits may be used to practice this invention. For example, buffer 16 may be a transistor source follower 21 as shown in FIG. 3, or a transistor emitter follower 23 as shown in FIG. 4.

In FIG. 2, an alternative embodiment of the invention is shown. The output impedance of the network formed by capacitor 18 and resistor 19 is selected to be low enough to drive the network of capacitor 22 and resistors 24 and 26. Thus, buffer 20 of FIG. 1 is omitted.

Buffer 17 produces an output pulse of the same polarity as its input pulse.

As will now be recognized, the invention utilizes two modes of operation. In a small signal mode, feedback of the signal to diode 36 in the non-conducting condition reduces the effective capacitance which permits a high value of load resistor 14 with low noise and high gain.

A strong signal mode involves clamping diode 30 conducting to produce a low impedance load for light detector 12 through diode 36, producing a limited output voltage to buffer 16. A low value of shunt resistor 28 results in fast recovery of diode 30. This action allows high detector currents without overload of buffer 16 or major changes in the DC bias voltage across the detector. Thus, the invention provides a laser distance measuring receiver input circuit accepting a wide range of input signals without overloading or saturation of the preamplifier, yet permitting controlled rapid recovery from large signals with low noise and high sensitivity operation.

Buffer 17 in FIG. 2 may be any suitable amplifier type. For example, it can be a transistor source follower 21 as shown in FIG. 3, or a transistor emitter follower 23 as shown in FIG. 4

It is to be understood that the circuits shown are for exemplary purposes only, and various modifications may be made without departing from spirit and scope of the invention.

I claim:

1. A preamplifier for a laser rangefinder receiver having two signal level modes comprising:
   a light detector having a first load resistor,
   a buffer having an input connected across said load resistor and an output to said receiver,
   a first diode in series with a second diode, said second diode connected in parallel with a second load resistor, said series connected first and second diodes connected in parallel with said first load resistor, and
   a positive feedback path from said output to the junction of said first and second diodes wherein the first and second diodes are nonconductive during a low signal level mode, and said first and second diodes are conductive during a high signal level mode.

2. A preamplifier for a laser rangefinder receiver as recited in claim 1 which further includes a second buffer in said feedback path.

3. A preamplifier for a laser rangefinder receiver as recited in claim 2 in which said second buffer includes a field effect transistor source follower.

4. A preamplifier for a laser rangefinder receiver as recited in claim 2 in which said second buffer is a transistor emitter follower.

5. A preamplifier for a laser rangefinder receiver as recited in claim 1 in which said first diode is a fast recovery Schottky type.

6. A preamplifier for a laser rangefinder receiver as recited in claim 1 in which said buffer is a transistor source follower.

7. A preamplifier for a laser rangefinder receiver as recited in claim 1 in which said buffer is a transistor emitter follower.

8. A preamplifier for a laser rangefinder receiver as recited in claim 1 in which said feedback path includes a capacitor in series with a resistor.

9. A preamplifier for a laser rangefinder receiver as recited in claim 8, in which the resistance of said resistor is low and the capacitance of said capacitor is small, to limit a feedback current therethrough.

10. A preamplifier for a laser rangefinder receiver as recited in claim 1, where the feedback is taken from the output.

11. A preamplifier for a laser rangefinder receiver comprising:
    a light detector having a first load resistor for producing a voltage pulse from pulses of laser light,
    a buffer having an input connected to said first load resistor and a low impedance output for connection to said receiver,
    a second load resistor connected in parallel with said first load resistor via a normally nonconducting first diode,
    a second normally nonconducting diode connected in parallel with said second load resistor, and
    a positive feedback network connecting said output of said buffer to said second load resistor to produce essentially equal potentials across said nonconducting first diode responsive to a small voltage pulse from said light detector, thereby preventing charge or discharge of the capacitance of said first diode, and to cause said first and second diodes to conduct responsive to a large voltage pulse from said light detector thereby producing a low value of load resistance to said light detector and limiting the amplitude of a pulse at said output.

12. The preamplifier as recited in claim 11 in which said positive feedback network includes a second buffer.

* * * * *